US010867844B2

(12) United States Patent
Wang et al.

(10) Patent No.: US 10,867,844 B2
(45) Date of Patent: Dec. 15, 2020

(54) WET CLEANING WITH TUNABLE METAL RECESS FOR VIA PLUGS

(71) Applicant: Taiwan Semiconductor Manufacturing Co., Ltd., Hsin-Chu (TW)

(72) Inventors: Yu Shih Wang, Tainan (TW); Shian Wei Mao, Taipei (TW); Ming-Hsi Yeh, Hsinchu (TW); Kuo-Bin Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/939,025

(22) Filed: Mar. 28, 2018

(65) Prior Publication Data
US 2019/0304834 A1    Oct. 3, 2019

(51) Int. Cl.
*H01L 21/768* (2006.01)
*H01L 23/522* (2006.01)
*H01L 23/00* (2006.01)

(52) U.S. Cl.
CPC .. *H01L 21/76831* (2013.01); *H01L 21/76805* (2013.01); *H01L 21/76877* (2013.01); *H01L 23/5226* (2013.01); *H01L 23/564* (2013.01)

(58) Field of Classification Search
None
See application file for complete search history.

(56) References Cited

U.S. PATENT DOCUMENTS

| 6,579,798 | B2 | 6/2003 | Chatterjee et al. |
| 6,620,027 | B2 | 9/2003 | Zutshi et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,083,863 | B1* | 9/2018 | Hsieh ................ H01L 21/31116 |
| 2002/0105089 | A1* | 8/2002 | Tanaka .............. H01L 21/76802 257/774 |

(Continued)

OTHER PUBLICATIONS

Testing and Analysis Service: Safe Interaction of Human & Advanced Machine, 2013, 3 pages, Korea Sensor Lab, Korea.

*Primary Examiner* — Nicholas J Tobergte
*Assistant Examiner* — Kien C Ly
(74) *Attorney, Agent, or Firm* — Haynes and Boone, LLP

(57) ABSTRACT

In one exemplary aspect, a method comprises providing a semiconductor structure having a substrate, one or more first dielectric layers over the substrate, a first metal plug in the one or more first dielectric layers, and one or more second dielectric layers over the one or more first dielectric layers and the first metal plug. The method further comprises etching a via hole into the one or more second dielectric layers to expose the first metal plug, etching a top surface of the first metal plug to create a recess thereon, and applying a metal corrosion protectant comprising a metal corrosion inhibitor to the top surface of the first metal plug.

20 Claims, 5 Drawing Sheets

(56) References Cited

U.S. PATENT DOCUMENTS

| | | | | |
|---|---|---|---|---|
| 2003/0203624 A1* | 10/2003 | Sameshima | .............. | C09G 1/04 |
| | | | | 438/687 |
| 2003/0203625 A1* | 10/2003 | Tai | .................... | H01L 21/02071 |
| | | | | 438/689 |
| 2013/0344696 A1* | 12/2013 | Li | ..................... | H01L 21/76898 |
| | | | | 438/693 |
| 2015/0221658 A1* | 8/2015 | Wang | .................... | H01L 21/324 |
| | | | | 257/532 |
| 2015/0318333 A1* | 11/2015 | Narayanan | ........ | H01L 23/53238 |
| | | | | 257/4 |

* cited by examiner

WET CLEANING WITH TUNABLE METAL RECESS FOR VIA PLUGS

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing ICs. For example, via plugs are used across multiple dielectric layers as metal interconnect. As the down-scaling continues, via plugs become smaller and smaller. As interface area between upper and lower via plugs decreases, contact resistance increases, sometimes rendering devices unusable. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
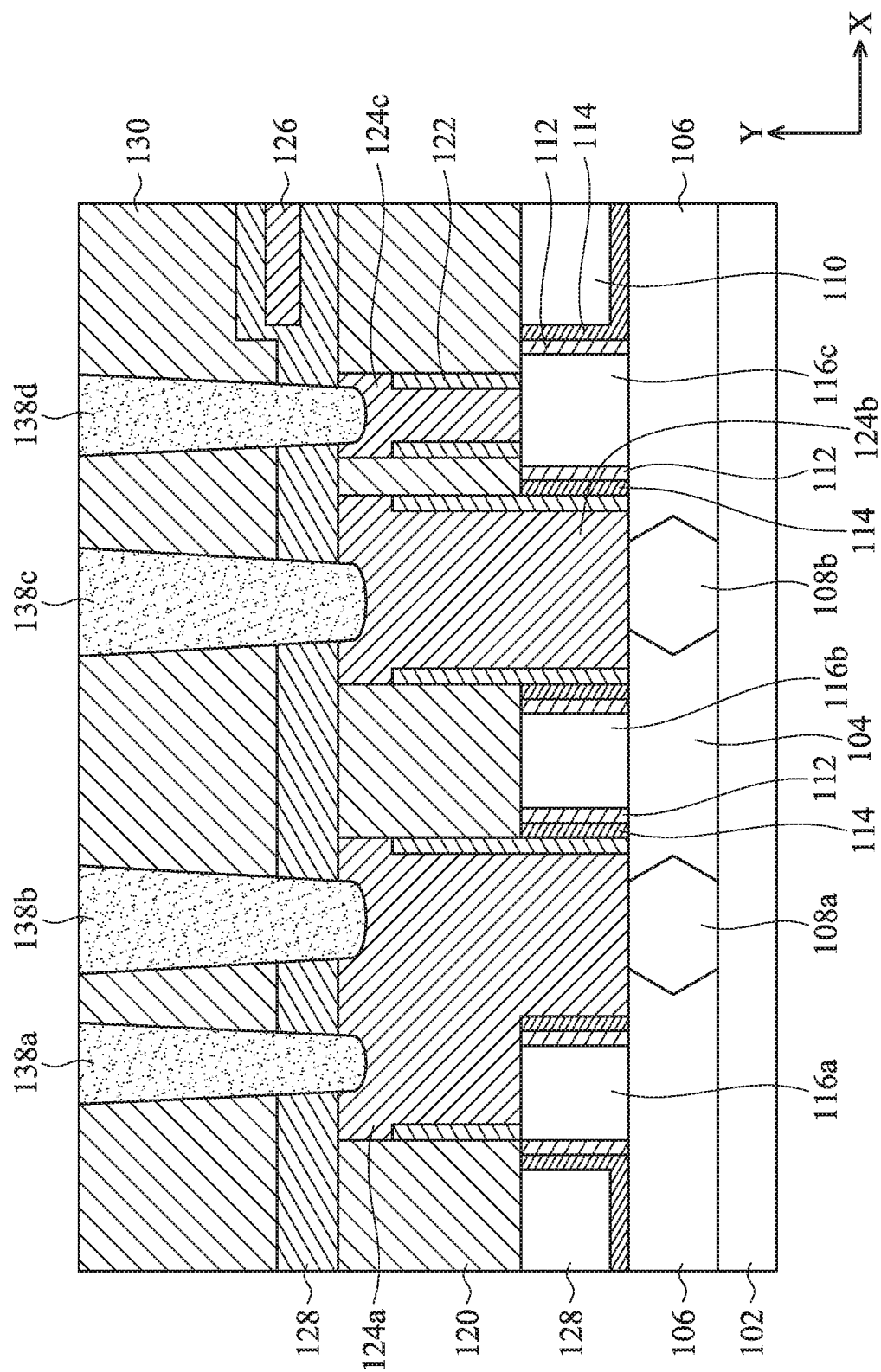
FIG. 1 is a schematic diagram showing a cross-sectional view of a semiconductor structure constructed according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to semiconductor devices and fabrication methods, and more particularly to metal plugs for interconnecting conductive features between different layers of an integrated circuit (IC). In order to minimize contact resistance between metal vias across multiple layers, forming metal recesses on a lower via provides an approach for reducing contact resistance by increasing contact area. But, once a metal recess is formed during a post-via wet cleaning process, it is difficult to prevent undesirable corrosion of the metal, which negatively impacts metal integrity and uncontrollably alters the profile of the recess. The wet cleaning process disclosed herein realizes in-situ metal recess and corrosion suppression, thereby creating determinative metal recesses without further metal corrosion. Metal recesses may thus have tunable and uniform profiles, which help improve device performance.

FIG. 1 is a schematic diagram illustrating a cross-sectional view of a semiconductor device (or semiconductor structure) 100, constructed according to embodiments of the present disclosure. The device 100 includes a substrate 102, an active region 104 disposed on the substrate 102, and isolation structures 106 that isolate the active region 104 from other active regions not shown in FIG. 1. Various active and passive devices may be built in or on active regions including 104, such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, static random access memory (SRAM) cells, other memory cells, resistors, capacitors, and inductors.

The device 100 further includes transistor source/drain (S/D) features including 108a and 108b; transistor gate stacks (or gate structures or gate features) including 116a, 116b, and 116c; gate spacers including 112 and 114; dielectric layers including 110, 120, and 130; lower plugs including 124a, 124b, and 124c; upper plugs including 138a, 138b, 138c, and 138d; a via barrier layer 122; a metal contact etch stop layer (MCESL) 128, and a conductive feature 126. The device 100 may include various other features not shown in FIG. 1. The device 100's components are further described below.

The substrate 102 is a semiconductor substrate (e.g., a silicon wafer) in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. The substrate 102 may include indium tin oxide (ITO) glass, include silicon on insulator (SOI) substrate, be strained and/or stressed for performance enhancement, include epitaxial regions, doped regions, and/or include other suitable features and layers.

The active region 104 may include one or more layers of semiconductor materials such as silicon or silicon germanium, and may be doped with proper dopants for forming active or passive devices. In an embodiment, the active region 104 includes multiple alternating layers of semiconductor materials (e.g., with multiple layers of silicon and multiple layers of silicon germanium alternately stacked). The active region 104 may be a planar structure, for example, for forming planar transistors. Alternatively or additionally, the active region 104 may include three-dimensional (3D) structures such as fins, e.g., for forming multi-gate or 3D transistors such as FinFETs.

The active region 104 may be patterned by any suitable method. For example, the active region 104 may be patterned using photolithography techniques including double-patterning or multi-patterning processes. Double-patterning or multi-patterning processes combine photolithography and self-aligned processes, allowing patterns to be created with pitches smaller than what is otherwise obtainable using a single, direct photolithography process. In an embodiment of patterning the active region 104, a sacrificial layer is first formed over the substrate 102 and patterned using a photolithography process. Spacers are formed alongside the patterned sacrificial layer using a self-aligned process. The sacrificial layer is then removed, and remaining spacers or mandrels may then be used as a masking element for patterning the active region 104. For example, the masking element may be used for etching depressions into semiconductor layers over or in the substrate 102, leaving the active region 104 on the substrate 102. Etching the depressions using the masking element may use dry etching, wet etching, reactive ion etching (RIE), and/or other suitable processes.

The isolation structures 106 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structures 106 are formed by etching trenches in or over the substrate 102 (e.g., as part of the process of forming the active region 104), filling the trenches with an insulating material, and performing a chemical mechanical planarization (CMP) process and/or an etch back process to the insulating material, thereby leaving the remaining insulating material as the isolation structures 106. Other types of isolation structures may also be suitable, such as field oxide and "LOCal Oxidation of Silicon" (LOCOS). The isolation structures 106 may include a multi-layer structure, for example, having one or more liner layers (on surfaces of the substrate 102 and the active region 104) and a main isolating layer over the one or more liner layers.

The S/D features 108a and 108b may include n-type doped silicon for NFETs, p-type doped silicon germanium for PFETs, or other suitable materials. The S/D features 108a and 108b may be formed by etching depressions in the active region 104 adjacent to the gate spacers 112 and 114, and then epitaxially growing semiconductor materials in the depressions. The epitaxially grown semiconductor materials may be doped with proper dopants in-situ or ex-situ. The S/D features 108a and 108b may have any suitable shape and may be wholly or partially embedded in the active region 104.

The gate spacers 112 may include a dielectric material, such as silicon oxide or silicon oxynitride. The gate spacers 114 may include a dielectric material, such as silicon oxide, silicon nitride, silicon oxynitride, silicon carbide, other dielectric material, or combinations thereof. The gate spacers 112 and 114 may be formed by deposition (e.g., chemical vapor deposition (CVD) or physical vapor deposition (PVD)) and etching processes.

Each gate stack (e.g., 116a, 116b, or 116c) may include a gate dielectric layer and a gate electrode layer, and may further include an interfacial layer under the gate dielectric layer. The interfacial layer may include a dielectric material such as $SiO_2$ or SiON, and may be formed by chemical oxidation, thermal oxidation, atomic layer deposition (ALD), CVD, and/or other suitable methods. The gate dielectric layer may include $SiO_2$ or a high-k dielectric material such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer may be deposited using CVD, PVD, ALD, and/or other suitable methods.

The gate electrode layer of the gate stack 116a, 116b, or 116c may include polysilicon and/or one or more metal layers. For example, the gate electrode layer may include work function metal layer(s), conductive barrier layer(s), and metal fill layer(s). The work function metal layer may be a p-type or an n-type work function layer depending on device type. The p-type work function layer may comprise titanium aluminum nitride (TiAlN), titanium nitride (TiN), tantalum nitride (TaN), ruthenium (Ru), molybdenum (Mo), tungsten (W), platinum (Pt), another suitable metal, or combinations thereof. The n-type work function layer may comprise titanium (Ti), aluminum (Al), tantalum carbide (TaC), tantalum carbide nitride (TaCN), tantalum silicon nitride (TaSiN), titanium aluminum nitride (TiAlN), titanium silicon nitride (TiSiN), another suitable metal, or combinations thereof. The metal fill layer may include aluminum (Al), tungsten (W), cobalt (Co), and/or other suitable materials. The gate electrode layer may be deposited using methods such as CVD, PVD, plating, and/or other suitable processes.

The gate stacks 116a-116c may be formed by any suitable processes such as gate-first processes and gate-last processes. In an example gate-first process, various material layers are deposited and patterned to become the gate stacks 116a-116c before the S/D features 108a and 108b are formed. In an example gate-last process (also called a gate replacement process), temporary gate structures are formed first. Then, after transistor source/drain features 108 are formed, the temporary gate structures are removed and replaced with the gate stacks 116a-116c. In the embodiment shown in FIG. 1, the gate stack 116b is disposed over a channel region of a transistor and functions as a gate terminal. Although not shown in this cross-sectional view, a metal plug may be disposed over the gate stack 116b (e.g., to apply an adjustable voltage to the gate stack 116b in order to control the channel region between the S/D features 108a and 108b).

The dielectric layers 110, 120, and 130 are also called interlayer dielectric (ILD) layers. Each of the ILD layers 110, 120, and 130 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Each ILD layer may be formed by plasma enhanced CVD (PECVD), flowable CVD (FCVD), or other suitable methods. The ILD layers 110, 120, and 130 may have the same or different materials.

As shown in FIG. 1, the barrier layer 122 includes barrier features disposed on sidewalls of the lower plugs 124a-124c. In some embodiments, a barrier feature includes dual barriers—a first barrier on sidewalls of the lower plugs 124a-124c and a second barrier over sidewalls of the first barrier (e.g., between the first barrier and the ILD layer 120). In an embodiment, the first barrier includes TiN or TaN, and the second barrier includes silicon nitride ($Si_3N_4$). The barrier layer 122 may be formed by CVD, ALD, or other suitable methods.

The lower plugs 124a and 124b are disposed over and are in electrical contact with the S/D features 108a and 108b, respectively. In the embodiment shown in FIG. 1, the plug 124a for example is directly connected to the S/D feature 108 without an intermediate silicide feature. In an alternative embodiment, the plug 124a is coupled to the S/D feature 108 through a silicide feature. The silicide feature may be formed by a process that includes depositing a metal layer, annealing the metal layer such that the metal layer reacts with the semiconductor material(s) in the S/D feature 108a to form silicide, and then removing the non-reacted metal layer. The silicide feature may include nickel silicide, titanium silicide, cobalt silicide, or other suitable silicidation or germanosilicidation. The lower plug 124c is disposed over and is in electrical contact (directly or indirectly) with the gate stack 116c. The lower plugs 124a-124c may be formed by CVD, PVD, plating, or other suitable methods. The lower plugs 124a-124c may include tungsten (W), cobalt (Co), copper (Cu), and/or other suitable materials. Note that metal plugs disclosed herein, such as the lower plugs 124a-124c and the upper plugs 138a-138d, may also contain non-metal material(s). A metal plug is sometimes also called a via, a via plug, a metal contact, or a contact plug.

The MCESL 128 may comprise silicon nitride, silicon oxynitride, silicon nitride with oxygen (O) or carbon (C) elements, and/or other materials; and may be formed by CVD, PVD, ALD, or other suitable methods. The MCESL 128 may include multiple layers (e.g., multiple dielectric layers deposited at different times).

The conductive feature 126 may include any suitable conductive material(s). In an embodiment, the conductive feature 126 provides relatively high electrical resistance (e.g., as part of a resistor). To further this embodiment, the conductive feature 126 may include titanium nitride or other suitable material(s). As shown in FIG. 1, the MCESL 128 has multiple layers, and the conductive feature 126 may be formed by a procedure that includes depositing a conductive layer (e.g., TiN) over a first layer of the MCESL 128, forming a dielectric hard mask layer over the conductive layer, patterning the dielectric hard mask layer and the conductive layer, and depositing a second layer of the MCESL 128, thereby embedding the conductive feature 126 within the MCESL 128.

The upper plugs 138a-138d are disposed over and are in electrical contact with the lower plugs 124a-124c, as shown in FIG. 1. Note that bottom portions of the upper plugs 138a-138d extend into recessed top portions of the lower plugs 124a-124c. Such a curved interface between the upper and lower plugs minimizes contact resistance. The formation of this interface is further described below.

Figure 2:
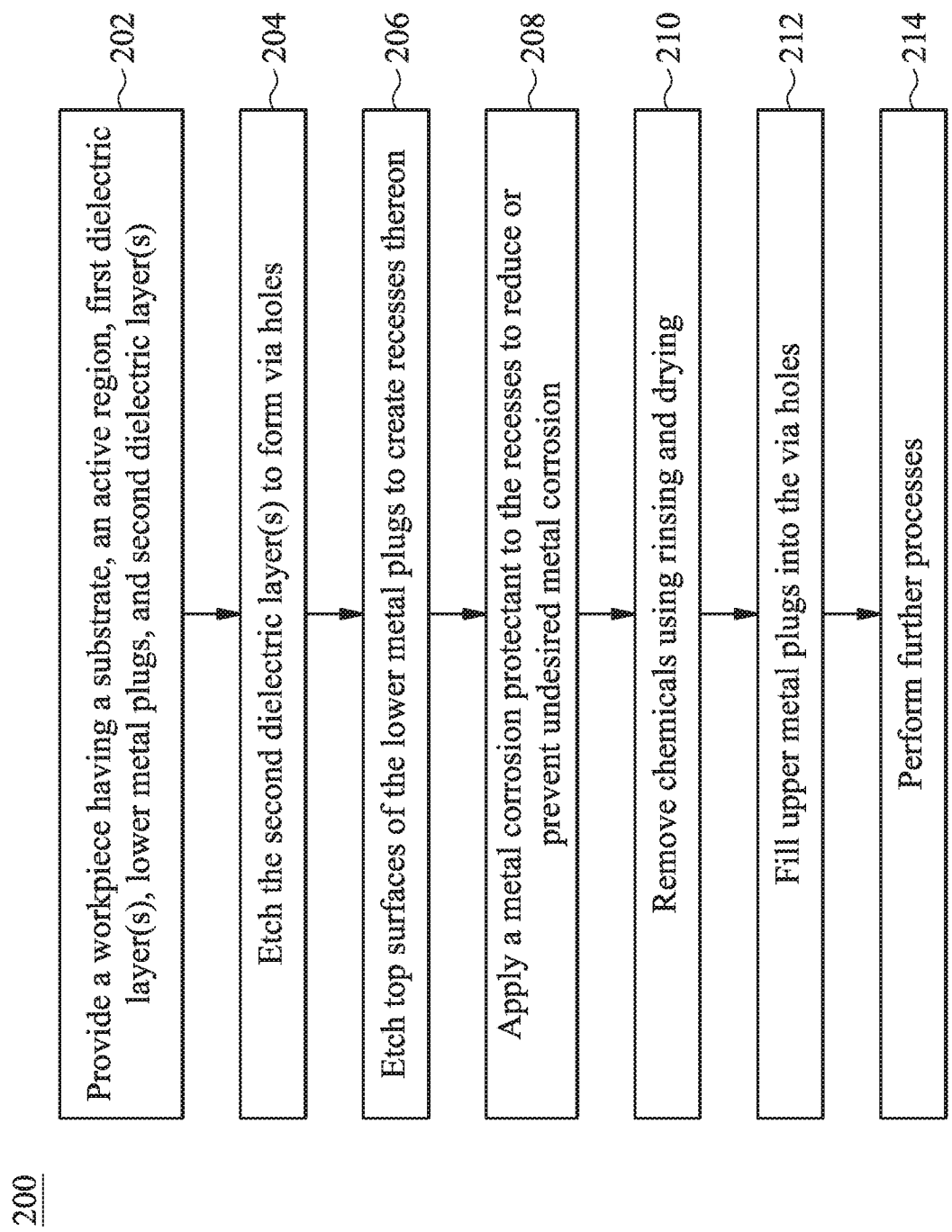
FIG. 2 is a flow chart showing a method for forming the semiconductor structure shown in FIG. 1, according to various embodiments of the present disclosure.

FIG. 2 is a flow chart illustrating a method 200 for forming the semiconductor device 100 in accordance with some embodiments. The method 200 is merely an example, and is not intended to limit the present disclosure beyond what is explicitly recited in the claims. Additional operations can be executed before, during, and after the method 200, and some operations described can be replaced, eliminated, or moved around for additional embodiments of the method 200. The method 200 is described below in conjunction with FIGS. 3-5, which illustrate cross-sectional views of the semiconductor device 100 during various fabrication stages.

Figure 3:
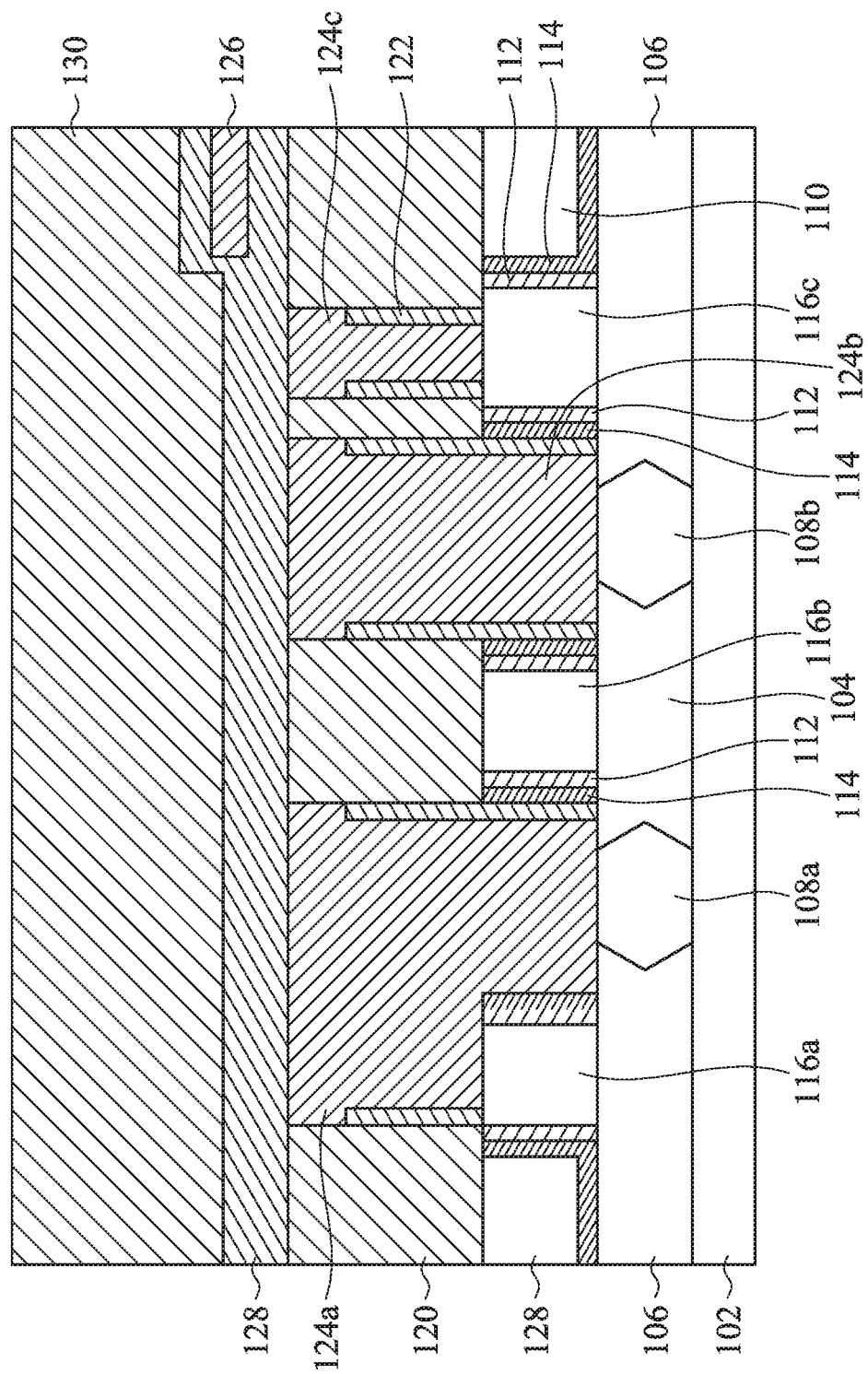
FIGS. 3, 4, and 5 illustrate cross-sectional views of a semiconductor structure during various fabrication stages various embodiments of the present disclosure.

At operation 202, the method 200 provides, or is provided with, a starting device structure (workpiece) 100, such as shown in FIG. 3. The device structure 100 includes the substrate 102, the active region 104, the isolation structures 106, the S/D features 108a and 108b, the gate stacks 116a-116c, the gate spacers 112 and 114, the ILD layers 110, 120, and 130, the lower plugs 124a-124c, the barrier layer 122, the conductive feature 126, and the MCESL 128. These various features have been discussed above with reference to FIG. 1.

Figure 4:
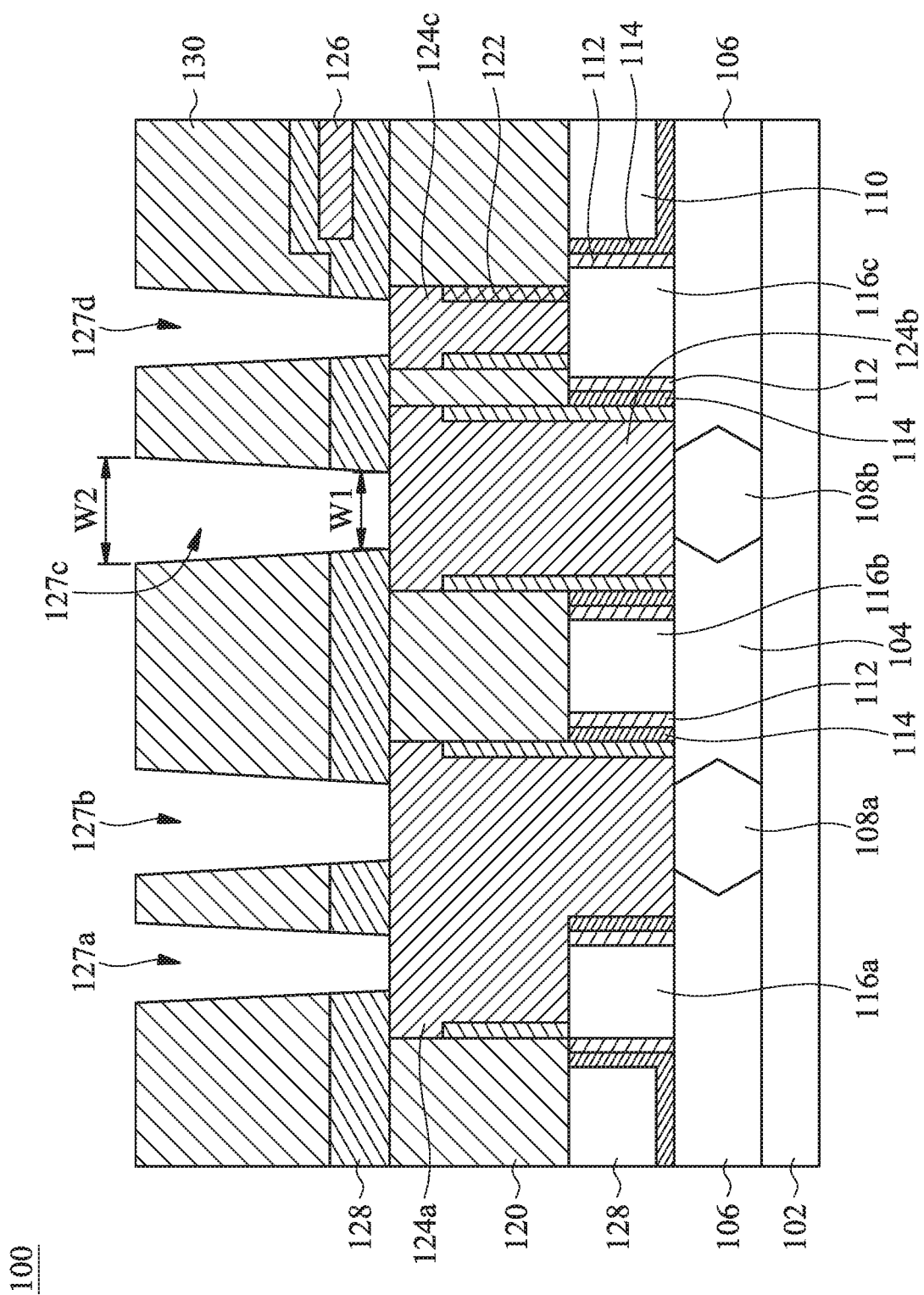

Referring to FIG. 4, at operation 204, the method 200 etches the ILD layer 130 and the MCESL 128 to form via holes including 127a, 127b, 127c, and 127d. The via holes 127a-127d are etched above their respective lower plugs 124a-124c. Specifically, as an example, two via holes 127a and 127b are etched over the lower plug 124a, which is relatively wider than the rest of the lower plugs 124b and 124c. The via hole 127c is etched over the lower plug 124b, and the via hole 127d is etched over the lower plug 124c. Thus, a lower plug may have one or more via holes etched thereon. In some embodiments, certain lower plugs may not have any via holes etched thereon. As shown in FIG. 4, the via holes 127a-127d at least partially expose respective top surfaces of the lower plugs 124a-124c.

In an embodiment, operation 204 includes a photolithography process and one or more etching processes. For example, operation 204 may form a patterned photoresist over the device 100 by photoresist coating, exposing, post-exposure baking, and developing. Then, the operation 204 etches the layers 128 and 130 using the patterned photoresist or a derivative as an etch mask to form the via holes 127. The etching process may include wet etching, dry etching, reactive ion etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, or other suitable gases and/or plasmas, or combinations thereof. For example, a wet etching process may comprise etching in diluted hydrofluoric acid (DHF), potassium hydroxide (KOH) solution, ammonia, an acid solution (e.g., containing hydrofluoric acid (HF), nitric acid ($HNO_3$), and/or acetic acid ($CH_3COOH$)), or other suitable wet etchants, or combinations thereof. Following the etching process, the patterned photoresist is removed, for example, by resist stripping.

Following operation 204, the method 200 enters into a wet cleaning process (sometimes called a post-via wet clean). The wet cleaning process disclosed herein includes multiple steps and serves multiple purposes (e.g., it creates recesses—on the top surfaces of the lower plugs 124a-124c—with tunable profiles and smooth surfaces). In the embodiment shown in FIG. 2, the wet cleaning process includes operations 206, 208, and 210, which are discussed below.

Figure 5:
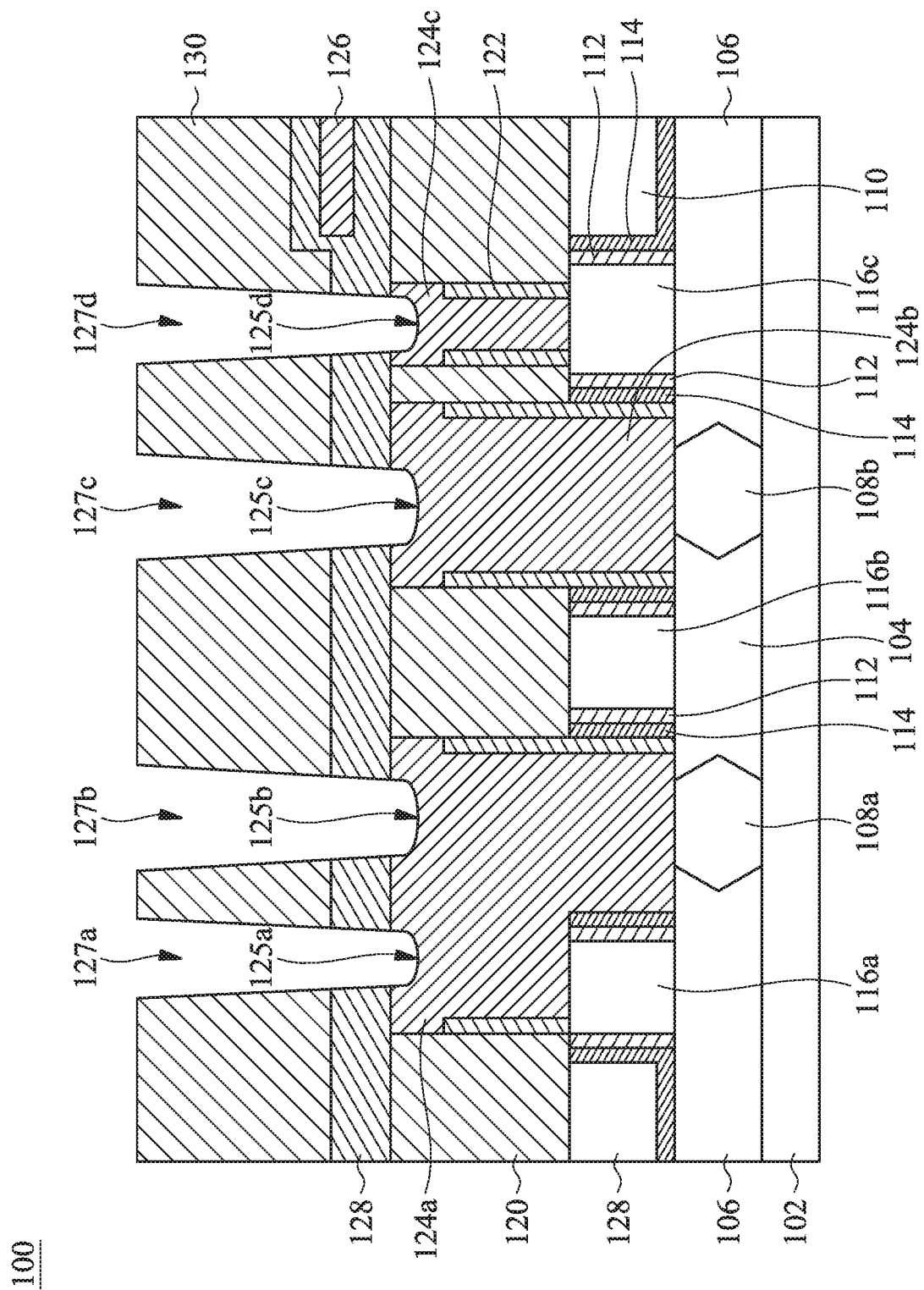

At operation 206, the method 200 etches the top portions of the lower plugs 124a-124c to deepen the via holes 138a-138d. Referring to FIG. 5, recesses including 125a, 125b, 125c, and 125d are created on top surfaces of the lower plugs 124a-124c. Operation 206 may be considered an extension of the etching process performed in operation 204, but may use different processes and materials from operation 204. For example, in some embodiments, operation 206 does not use a dry etching process but rather uses a wet etching process targeting lower plugs 124a-124c. As part of the wet cleaning process, operation 206 also removes any residues formed during operation 204 on the top surfaces of the lower plugs 124a-124c. Operation 206 may soak the device 100 (shown in FIG. 4) in a wet etchant containing diluted ammonium hydroxide ($NH_4OH$), carbon dioxide ($CO_2$) blended deionized (DI) water, ozone ($O_3$) blended DI water, hydrogen peroxide ($H_2O_2$) blended DI water, or other suitable chemicals, or combinations thereof. The chemicals may have any suitable concentrations. In an embodiment, operation 206 uses hydrogen peroxide blended DI water with a $H_2O_2:H_2O$ volume ratio range between 1:5 and 1:30.

In an embodiment, operation 206 uses isotropic etching to create the recesses 125a-125d with smooth surface profiles. When isotropic etching is used, the depth and top opening area of the recesses 125a-125d are correlated, which leads to a bowl shaped cross-sectional profile. Dimensions of the recesses 125a-125d may be tunable or quantitatively controllable via adjustment of various process conditions such as etching time and temperature. For example, a prolonged immersion period in a wet etchant, or a higher temperature, or a combination of both leads to wider and deeper recesses 125a-125d. Different etching solutions and materials of the lower plugs 124a-124c may use different durations and temperatures. In some embodiments, the etching process in operation 206 lasts between 20 to 100 seconds (e.g., about 30 or about 50 seconds) and is performed between room temperature and about 67 degrees Celsius.

The tunable profiles of the recesses 125a-125d with smooth surfaces helps control contact resistance between the lower plugs 124a-124c and upper plugs 138a-138d (to be formed in operation 212). A wider and deeper recess leads to a larger interface area between a lower plug and an upper plug, thereby leading to a smaller contact resistance, but an overly wide and deep recess may have drawbacks such as damaging sidewalls of lower plugs (e.g., the lower plug 124c shown in FIG. 5) that are relatively narrower and causing metal contact leak. Since a lower plug may have one or more via holes etched thereon, the profiles of recesses on each lower plug may or may not be the same. In an embodiment, dimensions of the recesses 125a-125d are substantially equal or uniform.

Following operation 206, the wet etchant used in forming the recesses 125a-125d should be removed, e.g., using a drying process. One problem that has plagued some wet cleaning processes is that, even if ideal recesses were formed initially, during the drying process the wet etchant would continue to remove material(s) from top surfaces of the lower plugs 124a-124c, thereby leading to uneven and uncontrollable recess profiles. Such poor recess profiles reduces uniformity across lower plugs (e.g., different contact resistance values on different lower plugs), which reduces product yield. To solve this problem, at operation 208 the method 200 applies a metal corrosion protectant (sometimes called a metal compatible chemical) to the recesses 125a-125d in order to reduce—or even prevent—undesired corrosion of the lower plugs 124a-124c. The metal corrosion protectant may be or include a metal corrosion inhibitor that decreases the corrosion rate of materials in the lower plugs 124a-124c. Different metals work with different corrosion inhibitors. Therefore, depending on the material makeup of the lower plugs 124a-124c, suitable corrosion inhibitors including commercially available inhibitors may be used.

The metal corrosion protectant is applied in a suitable manner. For example, the metal corrosion protectant may be applied right after (e.g., within 1, 2, 5, or 10 seconds) the recesses 125a-125d have reached pre-defined target profiles in order to prevent further corrosion. The pre-defined profile may be a bowl shaped recess with pre-defined dimensions and substantially smooth surfaces (e.g., surface roughness lower than a certain threshold such as 10 nm). The timing matters, because applying the metal corrosion protectant prematurely would impede the formation of target recess profiles (e.g., if corrosion inhibitor is applied at the beginning, no recess may form at all), and applying the metal corrosion protectant too late may mean that the corrosion may have already occurred. In some embodiments, operation 208 soaks or immerses the device 100 shown in FIG. 5 into a new chemical containing a metal corrosion inhibitor. In other embodiments, operation 208 adds the metal corrosion inhibitor into the wet etchant used in operation 206. Various mechanisms may be used to help the metal corrosion inhibitor reach the top surfaces of the lower plugs 124a-124c, where the metal corrosion inhibitor protects underlying metals from continued etching or corrosion by the wet etchant used in operation 206. Operation 208 may last for any suitable time period and be performed at any suitable temperature. In some embodiments, operation 208 lasts between 30 to 90 seconds (e.g., about 30, about 60, or about 90 seconds).

At operation 210, the method 200 removes chemicals from operations 206 and 208, e.g., by using rinsing and drying processes. Due to the presence of the metal corrosion protectant, corrosion of the lower plugs 124a-124c is effectively reduced or prevented during the rinsing and drying processes. Therefore, profiles of the recesses 125a-125d are maintained. In some embodiments, a rinsing process uses isopropyl alcohol (IPA), acetone, methanol, other suitable rinse solutions, or combinations thereof. In some embodiments, a drying process includes spinning the device 100 on a wafer chuck to drain away any remaining chemicals. Drying may be performed at room temperature, but elevated temperature may reduce drying time.

Since chemicals and process conditions (e.g., time and temperature) used in the one operation affect the next operation, the control of operations 206, 208, and 210 may be coordinated to optimize recess profiles. In some embodiments, operations 206 and 208 are performed with a combined duration between 30 to 300 seconds and between the room temperature to about 67 degrees Celsius. An elevated temperature may help reduce process time but may impact other aspects such as functionality of wet etchant and/or metal corrosion inhibitor. The material makeup of the lower plugs 124a-124c affects the choice of wet etchant and metal corrosion inhibitor. Therefore, chemicals and process conditions may be adjusted or fine-tuned in order to optimize the formation and maintenance of tunable recess profiles.

In addition to forming tunable recess profiles, the wet cleaning process disclosed herein increases design flexibility in the sidewall profiles of via holes 127a-127d (and ultimately the sidewall profiles of upper plugs 138a-138d). For example, in some embodiments, the etching processes in operation 204 are controlled to produce a trapezoidal sidewall profile for the via holes 127a-127d. That is, as shown in FIG. 4 as an example, each via hole has respective a bottom opening width (W1, measured at the bottom level of the MCESL 128 as if no recess existed) that is less than a respective top opening width (W2) of the via hole. On one hand, if the via holes 127a-127d are too slanted (e.g., W1 is less than 50% of W2), the contact area between the upper plugs and lower plugs may be too small, which leads to undesirably high resistance. On the other hand, if the via holes 127a-127d are too upright (e.g., W1 is greater than 90% of W2), the lower corners of the via holes 127a-127d may not be properly filled, leaving voids therein. The presence of tunable recesses at the bottom of the via holes 127a-127d allows the ratio of W1 and W2 to be more flexible. On the one hand, even if W1 is less than 50% of W2, an upper plug and a lower plug may still have relatively low contact resistance due to the presence of the increased interfacial area. On the other hand, even if W1 is greater than 90% of W2, bowl shaped recesses at the bottom of the via hole 127a-127d help proper filling of their lower corners. In an embodiment, W1 is between 45% to 95% (e.g., between 45% and 50%, between 50% to 90%, or between 90 and 95%) of W2.

At operation 212, the method 200 forms the upper plugs 138a-138d, thereby leading to the device 100 shown in FIG. 1. The upper plugs 138a and 138b are grown over respective lower plugs 124a-124c and completely fill respective via holes 127a-127d. Due to the recesses 125a-125d, the bottom portions of the upper plugs 138a-138d extend into recessed top portions of the lower plugs 124a-124c. Such a curved interface between the upper and lower plugs reduces contact resistance. The upper plugs 138a-138d may include aluminum (Al), cobalt (Co), and/or other suitable materials. In some embodiments, the upper and lower plugs use different metal materials. Operation 212 may include a deposition process and a chemical mechanical planarization (CMP) process. Material(s) for the upper plugs 138a-138d is first deposited in the via holes 127a-127d and over the ILD layer 130, and then excessive material(s) is removed via CMP from the top surface of the ILD layer 130.

At operation 214, the method 200 performs further processes to the device 100. For example, the operation 214 may deposit another etch stop layer (ESL) and another ILD layer over the ILD layer 130, etch the newly deposited ESL and ILD layers to form trenches, and deposit a metal (e.g., copper) in the trenches to form metal wires. The metal wires are configured to interconnect upper plugs including 138a-138d as well as other circuit features. The operation 224 may repeat such process to build any number of layers of metal wires.

Although not intended to be limiting, one or more embodiments of the present disclosure provide many benefits to a semiconductor device and the formation thereof. For example, the wet cleaning process disclosed herein realizes in-situ metal recess and corrosion suppression, thereby creating determinative metal recesses without extra metal corrosion. Such metal recesses reduce contact resistance between upper and lower metal plugs and increases their design flexibility, which meets the demands for continued device down-scaling. Embodiments of the disclosed methods can be readily integrated into existing manufacturing processes and technologies, such as middle end of line (MEoL) and back end of line (BEoL) processes.

In one exemplary aspect, the present disclosure provides a method comprising providing a semiconductor structure having a substrate, one or more first dielectric layers over the substrate, a first metal plug in the one or more first dielectric layers, and one or more second dielectric layers over the one or more first dielectric layers and the first metal plug. The method further comprises etching a via hole into the one or more second dielectric layers to expose the first metal plug, etching a top surface of the first metal plug to create a recess thereon, and applying a metal corrosion protectant comprising a metal corrosion inhibitor to the top surface of the first metal plug. In an embodiment, dimensions of the recess are controlled by adjustment of process conditions including time and temperature for the etching of the top surface of the first metal plug. In an embodiment, the metal corrosion protectant is applied to the top surface of the first metal plug after the recess has reached a pre-defined target profile. In an embodiment, the pre-defined target profile is a bowl shape with a substantially smooth surface. In an embodiment, the method further comprises removing the metal corrosion protectant and a wet etchant used in the etching of the top surface of the first metal plug, and filling a second metal plug into the via hole including the recess. In an embodiment, the etching of the top surface of the first metal plug uses an isotropic etching process. In an embodiment, the wet etchant comprises one of carbon dioxide ($CO_2$) blended deionized (DI) water, ozone ($O_3$) blended DI water, and hydrogen peroxide ($H_2O_2$) blended DI water. Removing the metal corrosion protectant and the wet etchant comprises performing a rinsing process that uses isopropyl alcohol (IPA), acetone, methanol, or combinations thereof. In an embodiment, the via hole is a first via hole. The method further comprises etching, simultaneously with the etching of the first via hole, a second via hole into the one or more second dielectric layers to expose the first metal plug. In an embodiment, the via hole has a bottom opening width and a top opening width, and the bottom opening width is between 90% and 95% of the top opening width. In an embodiment, the first metal plug is disposed over and electrically connected to a transistor source/drain feature or a transistor gate feature.

In another exemplary aspect, the present disclosure provides a method comprising providing a semiconductor device having a substrate, an active region over the substrate, a lower plug disposed over the active region, and at least one ILD layer over the lower plug. The method further comprises etching a via hole into the at least one ILD layer to at least partially expose a top surface of the lower plug, and performing a wet cleaning process to deepen the via hole by creating a recess on the lower plug. Dimensions of the recess are tunable by controlling process conditions of the wet cleaning process. In an embodiment, the method further comprises filling an upper plug into the via hole, wherein the lower plug and the upper plug comprise different materials. In an embodiment, the wet cleaning process comprises applying a wet etchant on the top surface of the lower plug to create the recess thereon, applying a metal corrosion inhibitor to the top surface of the lower plug, and removing the metal corrosion inhibitor and the wet etchant using rinsing and drying processes. In an embodiment, the wet etchant comprises one of carbon dioxide ($CO_2$) blended deionized (DI) water, ozone ($O_3$) blended DI water, and hydrogen peroxide ($H_2O_2$) blended DI water. In an embodiment, the metal corrosion inhibitor is applied to the top surface of the first metal plug only after the dimensions of the recess have reached pre-defined values. In an embodiment, the lower plug is a first lower plug, the via hole is a first via hole, and the recess is a first recess. The method further comprises etching a second via hole into the at least one ILD layer to at least partially expose a top surface of a second lower plug. The wet cleaning process creates a second recess on the second lower plug, and dimensions of the second recess are substantially equal to corresponding dimensions of the first lower plug.

In another exemplary aspect, the present disclosure provides a semiconductor device comprising one or more first dielectric layers disposed over a substrate, a first via disposed in the one or more first dielectric layers, one or more second dielectric layers disposed over the first via, and a second via disposed in the one or more second dielectric layers, over the first via, and electrically connected to the first via. An interface between the first and second vias comprises a bowl shaped area. In an embodiment, the semiconductor device further comprises a third via disposed in the one or more second dielectric layers, over the first via, and electrically connected to the first via. The second and third vias have about equal depth. In an embodiment, the semiconductor device further comprises a fourth via disposed in the one or more first dielectric layers, and a fifth via disposed in the one or more second dielectric layers, over the fourth via, and electrically connected to the fourth via. The second, third, and fifth vias have about equal depth. In an embodiment, the first and second vias comprise different metals.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor structure having a first metal plug disposed in a first dielectric layer and a second dielectric layer disposed over the first dielectric layer and the first metal plug;
performing a first etching process to etch a via hole into the second dielectric layer to form an exposed first metal plug disposed in the first dielectric layer;
after the first etching process, performing a second etching process different from the first etching process to etch the exposed first metal plug via the via hole and form a recessed top surface of the exposed first metal plug; and
applying a metal corrosion protectant that includes a metal corrosion inhibitor to the recessed top surface of the exposed first metal plug, wherein the metal corrosion inhibitor is configured to decrease a corrosion rate of the exposed first metal plug during a subsequent process to which the first metal plug is exposed.

2. The method of claim 1, wherein dimensions of the recessed top surface of the exposed first metal plug are controlled by adjusting a time, a temperature, or both the time and the temperature for the second etching process.

3. The method of claim 1, wherein the metal corrosion protectant is applied to the recessed top surface of the exposed first metal plug after the recessed top surface of the exposed first metal plug has reached a pre-defined target profile.

4. The method of claim 3, wherein the pre-defined target profile is a bowl shape with a substantially smooth surface.

5. The method of claim 1, further comprising:
rinsing the exposed first metal plug via the via hole to remove a wet etchant used in the second etching process; and
forming a second metal plug in the via hole, wherein the second metal plug contacts the recessed top surface of the exposed first metal plug.

6. The method of claim 5, wherein the second etching process uses an isotropic etching process.

7. The method of claim 5, wherein the wet etchant includes carbon dioxide ($CO_2$) blended deionized (DI) water, ozone ($O_3$) blended DI water, hydrogen peroxide ($H_2O_2$) blended DI water, or a combination thereof.

8. The method of claim 5, wherein the rinsing of the exposed first metal plug uses isopropyl alcohol (IPA), acetone, methanol, or a combination thereof.

9. The method of claim 1, wherein the via hole is a first via hole, the method further comprising performing a third etching process, simultaneously with the first etching process, to etch a second via hole into the second dielectric layer to expose the first metal plug disposed in the first dielectric layer.

10. The method of claim 1, wherein the via hole has a bottom opening width and a top opening width, and wherein the bottom opening width is between 90% and 95% of the top opening width.

11. A method, comprising:
providing a semiconductor device having a first lower plug disposed in a first interlayer dielectric (ILD) layer and a second ILD layer disposed over the first ILD layer and the first lower plug;
etching a first via hole into the second ILD layer to form an at least partially exposed first lower plug disposed in the first ILD layer; and
performing a wet cleaning process via the first via hole to form a recessed top surface of the exposed first lower plug, wherein the wet cleaning process includes:
applying a wet etchant to the exposed first lower plug to form the recessed top surface of the exposed first lower plug,
applying a metal corrosion inhibitor to the recessed top surface of the exposed first lower plug, wherein the metal corrosion inhibitor is configured to decrease a corrosion rate of the exposed first lower plug during a rinsing process and a drying process, and
performing the rinsing process and the drying process on the exposed first lower plug.

12. The method of claim 11, further comprising filling an upper plug into the first via hole, wherein the first lower plug and the upper plug include different materials.

13. The method of claim 11, wherein dimensions of the recessed top surface of the exposed first lower plug are tunable by controlling a time, a temperature, or both the time and the temperature of the wet cleaning process.

14. The method of claim 13, wherein the metal corrosion inhibitor is applied to the recessed top surface of the exposed first lower plug after the dimensions of the recessed top surface of the exposed first lower plug have reached pre-defined values.

15. The method of claim 11, wherein the wet etchant comprises carbon dioxide ($CO_2$) blended deionized (DI) water, ozone ($O_3$) blended DI water, hydrogen peroxide ($H_2O_2$) blended DI water, or a combination thereof.

16. The method of claim 11, further comprising etching a second via hole into the second ILD layer to form an at least partially exposed second lower plug disposed in the first ILD layer, wherein the wet cleaning process further forms a recessed top surface of the exposed second lower plug, and wherein dimensions of the recessed top surface of the exposed second lower plug are substantially equal to the dimensions of the recessed top surface of the exposed first lower plug.

17. A method, comprising:
    etching a first metal plug using a wet etchant to form a recessed top surface of the first metal plug;
    after the etching of the first metal plug, applying a metal corrosion inhibitor to the recessed top surface of the first metal plug, wherein the metal corrosion inhibitor is configured to decrease a corrosion rate of the first metal plug during a rinsing process and a drying process; and
    after the applying of the metal corrosion inhibitor, performing the rinsing process and the drying process on the first metal plug.

18. The method of claim 17, further comprising:
    before the etching of the first metal plug, etching a via hole into a dielectric layer disposed over the first metal plug.

19. The method of claim 18, wherein the rinsing process removes a residue formed during the etching of the via hole.

20. The method of claim 17, wherein a time, a temperature, or both the time and the temperature are controlled during each of the etching of the first metal plug, the applying of the metal corrosion inhibitor, and the rinsing process to adjust a profile of the recessed top surface of the first metal plug.

* * * * *